(12) United States Patent
Mimoun et al.

(10) Patent No.: US 9,786,870 B2
(45) Date of Patent: Oct. 10, 2017

(54) SCATTERING FILM FOR OLED

(71) Applicant: SAINT-GOBAIN PERFORMANCE PLASTICS CORPORATION, Solon, OH (US)

(72) Inventors: Emmanuel Mimoun, Boulogne-Billancourt (FR); Michele Schiavoni, Paris (FR); Louis Garnier, Paris (FR); Francois Guillemot, Paris (FR)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 0 days.

(21) Appl. No.: 15/192,806

(22) Filed: Jun. 24, 2016

(65) Prior Publication Data

US 2016/0380237 A1    Dec. 29, 2016

(30) Foreign Application Priority Data

Jun. 26, 2015    (FR) ...................................... 15 55987

(51) Int. Cl.
| | |
|---|---|
| F21V 11/00 | (2015.01) |
| H01L 51/52 | (2006.01) |
| G02B 5/02 | (2006.01) |
| F21K 9/60 | (2016.01) |
| B05D 3/00 | (2006.01) |
| B05D 3/06 | (2006.01) |
| B05D 5/06 | (2006.01) |
| B05D 7/04 | (2006.01) |
| B05D 7/24 | (2006.01) |

(Continued)

(52) U.S. Cl.
CPC .......... *H01L 51/5268* (2013.01); *B05D 3/007* (2013.01); *B05D 3/06* (2013.01); *B05D 5/06* (2013.01); *B05D 7/04* (2013.01); *B05D 7/24* (2013.01); *F21K 9/60* (2016.08); *G02B 1/04* (2013.01); *G02B 1/08* (2013.01); *G02B 5/0242* (2013.01); *G02B 5/3083* (2013.01); *F21Y 2115/15* (2016.08)

(58) Field of Classification Search
USPC ....................... 262/355; 257/13, 98; 428/690
See application file for complete search history.

(56) References Cited

U.S. PATENT DOCUMENTS

2005/0142379 A1    6/2005   Juni et al.
2006/0049745 A1*   3/2006   Handa ................. H01L 51/5268
                                                            313/503

(Continued)

OTHER PUBLICATIONS

International Search Report for PCT/US2016/039407, dated Oct. 5, 2016, 1 page.

(Continued)

*Primary Examiner* — Daniel Hess
(74) *Attorney, Agent, or Firm* — Abel Law Group, LLP; Chi Suk Kim

(57) ABSTRACT

A process for the manufacture of a scattering polymer film can include (a) making available a film made of organic polymer, (b) applying, to one of the faces of the said film, a liquid composition (c) heating and/or irradiating the layer of liquid composition to form a cured scattering layer. A scattering polymer film can be obtained by this process. A substrate for OLED can include such a film adhesively bonded to a transparent substrate.

15 Claims, 2 Drawing Sheets

(51) Int. Cl.
*G02B 1/04* (2006.01)
*G02B 1/08* (2006.01)
*G02B 5/30* (2006.01)
*F21Y 115/15* (2016.01)

(56) References Cited

U.S. PATENT DOCUMENTS

| | | |
|---|---|---|
| 2011/0248256 A1 | 10/2011 | Cok et al. |
| 2011/0278622 A1 | 11/2011 | Wada et al. |
| 2014/0042422 A1 | 2/2014 | Silverman et al. |
| 2014/0264293 A1 | 9/2014 | Hatwar et al. |
| 2015/0014625 A1 | 1/2015 | Coe-Sullivan et al. |
| 2016/0172630 A1* | 6/2016 | Reusch ............... H01L 51/5268 257/40 |

OTHER PUBLICATIONS

Preliminary Search Report for FR1555987, dated Apr. 19, 2016, 1 page.

* cited by examiner

SCATTERING FILM FOR OLED

CROSS-REFERENCE TO RELATED APPLICATION

The current application claims priority to French Patent Application No. 1555987, filed Jun. 26, 2015, entitled "Scattering Film for OLED", naming as inventors Emmanuel Mimoun, Michele Schiavoni, Louis Gamier and Francois Guillemot, which application is incorporated by reference herein in its entirety.

FIELD OF THE DISCLOSURE

The present disclosure relates to an electroconductive support, an organic light-emitting device incorporating it and its manufacture.

RELATED ART

Aspects of the present invention relate to a scattering film made of plastic which may be used as internal extraction layer in supports for organic light-emitting diodes (OLEDs), as well as to a process for the manufacture of such a film and to an OLED support comprising such a scattering film.

BRIEF DESCRIPTION OF THE DRAWINGS

Embodiments are illustrated by way of example and are not limited in the accompanying figures.

Figure 1:
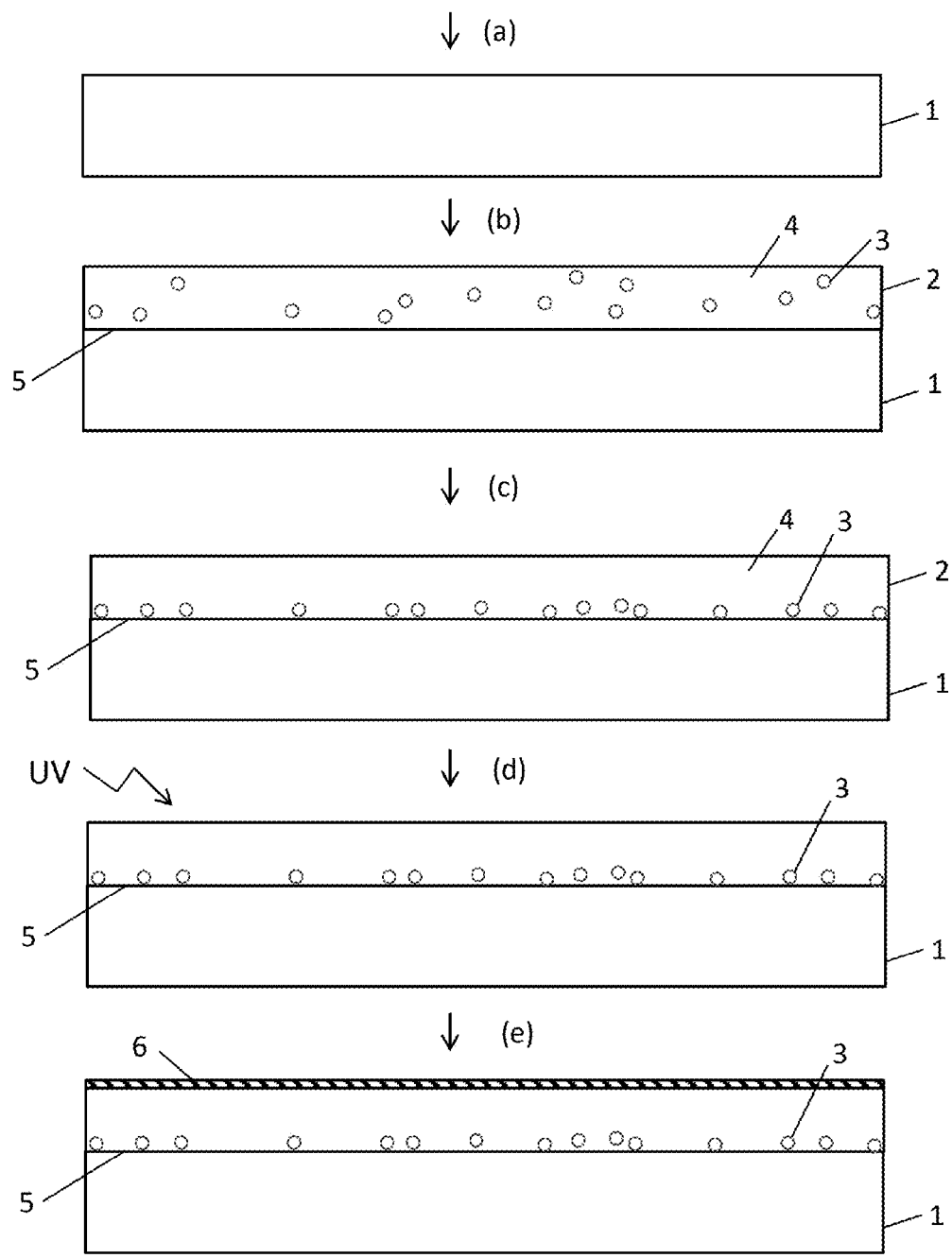
FIG. 1 graphically represents the various stages of the process of making a scattering film according to an embodiment described herein

It is specified that out of a concern for clarity, the various elements of the depicted objects are not shown to scale.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used in this specification, when a deposition of a layer or coating (including one or more layers) is specified as being done directly below or directly on another deposition, this means that no other layer may be interposed between those two depositions.

As used in this specification, refractive indices are measured at 550 nm.

As used herein, a positive photoresist is a type of photoresist for which the part exposed to the radiation, such as UV or visible light, becomes soluble with respect to a developer (developing solution) and where the unexposed part of the photoresist remains insoluble with respect to the developer. A negative photoresist is a type of photoresist for which the part exposed to radiation, such as UV or visible light, becomes insoluble with respect to a developer and where the unexposed part of the photoresist remains soluble with respect to the developer.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the electronic support and microelectronic arts.

An organic light-emitting diode (OLED) is an optoelectronic device comprising two electrodes, one at least of which is transparent to visible light, and a stack of thin layers comprising at least one light-emitting layer (LE layer). This light-emitting layer can be sandwiched at least between, on the one hand, an electron injection layer or electron transport layer (EIL or ETL) located between the LE layer and the cathode and, on the other hand, a hole injection layer or hole transport layer (HIL or HTL) located between the LE layer and the anode.

OLEDs comprising a transparent electrode support and a transparent electrode in contact with the latter are conventionally known as OLEDs having emission through the substrate or bottom-emitting OLEDs. In this case, the transparent electrode is typically the anode.

Analogously, OLEDs comprising an opaque electrode support can be referred to as top-emitting OLEDs, emission then taking place through the transparent electrode which is not in contact with the support, generally the cathode.

When a difference in potential is applied between the two electrodes (for example between a metal cathode and a transparent anode), electrons and holes are respectively injected via the electron transport layer and the hole transport layer, and combine in the LE layer with emission of light.

Only a small fraction of the light produced by the LE layer may be emitted towards the outside. This is because, as the optical index of the glass substrate ($n_{glass}$=1.5) is lower than that of the organic layers (n=1.7-1.8) and of the transparent anode (n=1.9 to 2.1), the major fraction (approximately 50%) of the light is trapped in these high index layers, as in a waveguide, and is absorbed after a certain propagation distance. A similar phenomenon occurs at the interface between the glass of the substrate ($n_{glass}$=1.5) and the air ($n_{air}$=1.0) and traps approximately 20% of the light emitted by the LE layer.

This phenomenon of light entrapment in the high index layers, also known as "total internal reflection", can be reduced by inserting, between the glass substrate and the transparent anode, a layer for the extraction of light formed, for example, by a matrix having a high refractive index in which scattering elements are dispersed. Such a scattering layer, located between the glass substrate and the transparent electrode, is known hereinafter as "internal extraction layer" or IEL.

Internal extraction layers (IELs) should be distinguished from external extraction layers (EELs), which include scattering layers located at the glass/air interface.

The internal extraction layers can be generally formed directly on the transparent substrate and can be subsequently coated with the transparent electrode and with the stack of thin organic layers. As well as their high refractive index of at least approximately 1.7 and their scattering nature, the internal extraction layers can exhibit an excellent surface condition (low roughness). The scattering layer can be covered with a high-index planarization layer devoid of scattering elements, the role of which can be to cover possible surface defects due, for example, to solid scattering elements projecting from the high-index matrix of the scattering layer.

IELs based on high-index enamels are described, for example, in Patent Applications WO 2011/126097, WO 2012/017183, EP 2 178 343 and EP 2 278 852. However, such IELs are inappropriate for supports made of ultrathin glass or plastic which do not withstand the high temperatures necessary for the melting of glass frits.

IELs having an organic matrix have been provided, for example in US 2005/0142379. However, it is difficult, indeed even impossible, to find on the market organic compositions, in particular thermosetting or photocurable compositions, which make it possible to obtain polymer layers having a refractive index of greater than 1.7. Thus, a high fraction of high-index inorganic nanoparticles which do not scatter light can be incorporated in the organic resin. In US 2005/0142379, this fraction of high-index non-scattering nanoparticles may range up to 500 parts per 100 parts of organic resin (see [0161]).

In the context of research studies targeted at developing flexible supports for OLEDs, it has now been found that the mechanical properties of IELs having an organic matrix including both scattering particles and high-index non-scattering nanoparticles may be unacceptable for and incompatible with the use of flexible supports. Notably, when the total fraction of inorganic particles (scattering and nonscattering) is too high, the IELs may become friable and adhere insufficiently to the neighbouring layers.

It has thus turned out to be very difficult to prepare IELs having an organic matrix exhibiting a refractive index of greater than 1.7 and which retain a good cohesiveness, flexibility and elasticity allowing them to be used in flexible OLEDs.

Embodiments, of the present disclosure take advantage of a discovery that it is possible to reduce the amount both of scattering particles and of nonscattering particles of an IEL having an organic matrix while retaining a good light-extracting power.

In one aspect, an IEL having two layers includes:
a first layer, which according to certain embodiments is a planarization layer, formed of a high-index polymer film devoid of scattering particles, possibly even devoid of inorganic particles,
a second layer, which according to certain embodiments is a scattering layer, having a lower refractive index than that of the first layer and comprising scattering particles which are not randomly dispersed in the whole of the layer but which are gathered together in the immediate vicinity of the interface between the first layer and the second layer.

In certain embodiments, this bilayer IEL is manufactured by forming, by the liquid route, the second layer (scattering layer) on the first layer (planarization layer). This way of forming an IEL is unusual. The planarization layer, which is devoid of scattering particles, is normally deposited on the scattering layer formed on a substrate. The transparent electrode and the organic layers are subsequently deposited on the planarization layer.

This reversal of the order of the stages of formation of these two layers is possible, in certain embodiments, due to the use of a polymer film having a high refractive index as planarization layer. This high-index polymer film, coated with the scattering layer, thus forms an "autonomous" or "self-standing" bilayer IEL.

The reversal of the order of the stages of formation of the two layers can contribute to achieving the higher concentration of the scattering elements in the vicinity of the interface between the planarization layer and the scattering layer. According to particular embodiments, the scattering elements have a density which is greater than that of the liquid phase in which they are dispersed, viscosity of this liquid phase is sufficiently low value, and the scattering elements settle out before curing the liquid phase.

It has been discovered that, when the great majority of the scattering particles were thus gathered together in the immediate vicinity of the planarization layer, it was not absolutely necessary for the matrix of the scattering layer to have a refractive index strictly greater than or equal to that of the planarization layer. A satisfactory extraction of light takes place even when the index of the matrix of the scattering layer is significantly lower than that of the planarization layer.

This disappearance of the constraint of a high index of the matrix of the scattering layer can make it possible to considerably reduce, indeed even to eliminate, the proportion of high-index non-scattering inorganic particles and to thus improve the mechanical properties of this IEL layer. It thus can be possible to use the self-standing bilayer IEL of the present invention on flexible substrates, involving high mechanical deformations and stresses during use.

The terms "self-standing bilayer IEL", "scattering polymer film" and "polymer film coated with a scattering layer" are used as synonyms and denote a flexible film made of a polymer having a high refractive index ($n_1$ at least equal to 1.70) coated on one of its faces with a scattering layer formed of an organic matrix including scattering particles gathered together in the immediate vicinity of the interface of the scattering layer and of the high-index film.

Aspects of the present invention include a self-standing bilayer IEL, a process for the manufacture of such a bilayer IEL, a scattering substrate for OLEDs comprising such a bilayer TEL and a process for the manufacture of such a scattering substrate for OLEDs.

In an embodiment, the process for the manufacture of a self-standing bilayer TEL, or of a scattering polymer film, includes:

providing a film made of organic polymer having a refractive index ($n_1$) at least equal to 1.70, applying, to one of the faces of the said film, a liquid composition comprising scattering particles having a size of between 200 nm and 2 μm and optionally nonscattering nanoparticles having a size of less than 50 nm, dispersed in a solution of polymerizable organic monomers and/or oligomers, the said scattering particles having a density which is greater than that of the solution of organic monomers and/or oligomers, leaving the film made of organic polymer thus coated with a layer of liquid composition for a time sufficient to allow the scattering particles to settle out down to the interface with the film made of organic polymer, heating and/or irradiating the layer of liquid composition so as to polymerize the organic monomers and/or oligomers and to form a cured scattering layer, the organic monomers and/or oligomers and the nonscattering nanoparticles optionally present in the liquid composition being chosen so that the cured scattering layer has a refractive index ($n_2$) of between $n_1$-0.15 and $n_1$-0.03.

In certain embodiments, the film made of organic polymer is generally a film drawn along one or two directions. Uniaxially oriented films, also known as uniaxially drawn films, are generally drawn in the direction of the length of the strip formed at the outlet of the extruder. Biaxially oriented films, also known as biaxially drawn films, are generally drawn in the direction of the length of the strip and in the direction of the width of the strip at the outlet of the extruder.

The drawing along one or two directions generates a birefringence of the film. Uniaxially oriented films or biaxially oriented films thus generally have three different refractive indices respectively measured:

along the first drawing direction (length of the strip), along a direction perpendicular to this first drawing direction (width of the strip), this direction being equal to the second drawing direction for a biaxially oriented film, and along the thickness of the film.

The term "refractive index measured along a given direction" of the film is understood to mean the index measured by means of a light beam having a polarization along the direction in question.

When the film made of organic polymer is a uniaxially oriented or biaxially oriented film, the refractive index ($n_1$) is measured along a direction in the plane of the film. The refractive index ($n_1$) of the drawn film—measured along any direction in the plane of the film—is thus greater than or equal to 1.70.

The index measured in the direction of the thickness of the film may be significantly less than 1.7, indeed even less than 1.6 and even less than 1.5.

However, embodiments of the present invention are not limited to films for which this third index, measured in the direction of the thickness, is less than 1.7. Advantageously, the refractive indices of the film, measured along the three directions, are greater than 1.7. In certain embodiments, the index measured along the direction of the thickness may not have a value of greater than or equal to 1.7.

The organic polymer film may be a nanocomposite, that is to say that it may comprise a certain fraction of inorganic nanoparticles added in order to increase the refractive index of the film. These particles should have a sufficiently small size, generally of less than 50 nm, in order as much as possible to limit Rayleigh scattering. The high-index nanoparticles capable of increasing the refractive index of the film made of organic polymer are, for example, nanoparticles made of $TiO_2$ or $ZrO_2$, preferably $ZrO_2$. The fraction of nanoparticles in the film is preferably less than 60% by volume, for example between 10 and 60% by volume, in particular less than 30% by volume, ideally less than 20% by volume.

In a particular embodiment, the film made of organic polymer is devoid of inorganic nanoparticles having a high refractive index.

Suitable polymers include polyesters or copolyesters based on naphthalene-2,6-dicarboxylic acid, on ethylene glycol and optionally on one or more comonomers, such as terephthalic acid. The organic polymer film may also be composed of a blend of poly(ethylene naphthalate) (PEN) and of poly(ethylene terephthalate) (PET).

In certain embodiments, the films are crystalline or semi-crystalline. Films made of PEN which may be used in the present invention are commercially available, for example under the names Teonex® Q51 and Teonex® Q65 HA, sold by DuPont Teijin Films.

The thickness of the film made of organic polymer can be between 50 μm and 200 μm, in particular between 70 μm and 150 μm.

Its absorption (absorption=1–light reflection–light transmission), at normal incidence, is the lowest possible; in a particular embodiment, less than 0.01.

As mentioned previously, the film made of organic polymer first can act as support for the formation of the scattering layer by the liquid route. After curing the matrix of the scattering layer, the bilayer IEL may be adhesively bonded to a transparent support, which is rigid or flexible, so that the scattering layer comes into contact with the said support and is sandwiched between the transparent support and the film made of organic polymer. After the bilayer IEL has been attached to the support, the film made of organic polymer then can act as a planarization layer, that is to say provides a perfectly flat and smooth surface for the deposition of the transparent anode and the stack of organic layers.

In an embodiment, the face of the film made of organic polymer which is not in contact with the scattering layer thus can exhibit a roughness profile such that the root mean square deviation $R_q$ (defined in point 4.2.2 of Standard ISO 4287), determined by AFM (over a surface area of 10 μm×10 μm), is less than 5 nm, preferably less than 3 nm and in particular less than 2 nm.

The adhesive bonding of the bilayer IEL is not, however, obligatory. When the components of the scattering layer are chosen so that this layer is nonadhesive and sufficiently resistant to abrasion, the scattering layer may be exposed directly to the atmosphere and the bilayer IEL may thus act as support for the OLED.

In stage (b) of the process, a liquid composition comprising scattering particles dispersed in a solution of polymerizable organic monomers and/or oligomers can be applied to one of the two faces of the high-index organic polymer film.

According to a particular embodiment, the scattering particles have a density that is greater than that of the solution of organic monomers and/or oligomers. In an embodiment, the scattering particles should be able, after application and before curing of the liquid composition, to settle out towards the interface which the layer of liquid composition forms with the underlying film made of organic polymer. The ability of the inorganic particles to approach, by settling out, the interface with the polymer film can depend on the viscosity of the solution of organic monomers and/or oligomers. The lower this is, the shorter the stage of settling out. The viscosity of the solution can be advantageously between 0.05 Pa·s and 5 Pa·s, preferably between 0.1 and 2 Pa·s, at 20° C.

In a particular embodiment of the invention, the inorganic particles form a monolayer or quasi-monolayer in the vicinity of the interface between the liquid phase and the polymer. Monolayer or quasi-monolayer is understood to mean, in this context, a distribution of scattering particles such that less than 30%, such as less than 20%, or even less than 10% by number of those which are in the immediate vicinity of the interface are separated from the interface by another scattering particle along a direction perpendicular to the interface. In other words, a monolayer or quasi-monolayer is achieved by limiting the amount of particle stacking at the interface.

In certain embodiments, to be able to thus gather together in the vicinity of the interface between the liquid phase and the polymer, the inorganic particles do not exceed a certain fraction by volume of the liquid composition applied. They can represent between approximately 0.2% and 5% by volume, in particular between 0.3% and 1.5% by volume, of the total liquid composition applied to the film made of organic polymer.

In certain embodiments, to ensure desirable dispersion of individual scattering particles in the liquid phase and to break up possible agglomerates, the liquid composition is advantageously subjected to an ultrasound treatment before being applied to the film.

The liquid composition may be applied to the film made of polymer, for example, by spin coating, by spray coating, using a bar coater machine or using a Mayer rod coater, by dip coating, by slot die coating or by roller coating.

In an embodiment, the solvent content of the solution of organic monomers and/or oligomers is preferably between approximately 30 and 70%, in particular between 40 and 60%, by weight. The solvent is preferably an aqueous or alcoholic solvent.

In an embodiment, the scattering particles are, for example, solid inorganic particles preferably having a refractive index which is greater than that of the cured matrix of the scattering layer. Mention may be made, by way of example, of $TiO_2$ or $ZrO_2$ particles.

In an embodiment, the scattering particles preferably have a size of between 300 nm and 1.5 μm, in particular between 400 nm and 800 nm.

In an embodiment, the organic monomers and/or oligomers may, for example, be of acrylic, styrene, vinyl or epoxide type. They cure by radical polymerization initiated by UV irradiation or by heating.

In an embodiment, the polymerizable organic monomers and oligomers are preferably chosen from (meth)acrylic monomers and oligomers. The term "(meth)acrylic" is understood to mean "acrylic" or "methacrylic". Mention may be made, as (meth)acrylic monomers, of acrylic or methacrylic acid esters comprising at least one acryloyl ($CH_2$=CH—CO—) or methacryloyl ($CH_2$=C($CH_3$)—CO—) functional group.

In an embodiment, the (meth)acrylic oligomers may, for example, be oligomers obtained by condensation of monomers, such as esters, ethers, urethanes and epoxides, functionalized with one or more acrylate or methacrylate functional groups.

In an embodiment, the monomeric (meth)acrylates may comprise one or more (meth)acrylate functional groups.

Mention may be made, as examples of monoacrylates, of $C_{1-6}$ alkyl acrylates and methacrylates, benzyl acrylate or methacrylate, 2-ethoxyethyl acrylate or methacrylate, phenyloxyethyl acrylate or methacrylate, hydroxypropyl acrylate or methacrylate, isobornyl acrylate or methacrylate, or lauryl acrylate or methacrylate.

In an embodiment, difunctional monomeric (meth)acrylates are, for example, chosen from the following: 1,4-butanediol di(meth)acrylate, ethylene glycol or propylene glycol di(meth)acrylate, 1,6-hexanediol di(meth)acrylate, bisphenol A di(meth)acrylate, trimethylolpropane di(meth)acrylate and tricyclodecanedimethanol di(meth)acrylate.

In an embodiment, trifunctional (meth)acrylic monomers are, for example, the following: trimethylolpropane tri(meth)acrylate or pentaerythritol tri(meth)acrylate, which is optionally ethoxylated or propoxylated.

Finally, mention may be made, as example of monomers comprising four, five or six (meth)acrylate functional groups, of pentaerythritol tetra(meth)acrylate, di(trimethylolpropane) tetra(meth)acrylate, di(pentaerythritol) penta(meth)acrylate or di(pentaerythritol) hexa(meth)acrylate.

Mention may be made, among the examples of commercial ready-for-use resins, of: the HA7663® resins (n=1.582) from Hitachi Chemicals, the UV Raylok WF21® resin from Cytec or also the SEA-B2304® resin (n=1.612) from Polygon Chemie AG.

In one embodiment, the liquid composition comprises not only scattering particles but also a certain fraction of inorganic particles having a high refractive index which are too small to scatter light, known hereinafter as nanoparticles. Their size does not exceed 50 nm.

These high-index non-scattering inorganic nanoparticles can increase the refractive index of the matrix of the scattering layer in which the scattering particles are dispersed. Their proportion by volume generally does not exceed 70% of the matrix of the scattering layer (nonscattering particles+monomers/oligomers). It is preferably between 10 and 60% by volume, in particular between 15 and 40% by volume, of the matrix of the scattering layer.

In an embodiment, the refractive index of the nonscattering particles is between 1.8 and 2.5.

Use will in particular be made of zirconia ($ZrO_2$) nanoparticles.

In an embodiment, the inorganic nanoparticles are advantageously functionalized at the surface with organic groups capable of reacting, in stage (d), with the monomers and/or oligomers. This functionalization of the inorganic nanoparticles significantly increases the cohesiveness of the cured scattering layer.

In an embodiment, the low proportion of non-scattering inorganic particles, in combination with a very low proportion by volume of scattering particles, confers excellent properties on the cured scattering layer. It exhibits a good mechanical strength, is flexible and does not disintegrate, even when the bilayer IEL is adhesively bonded to a flexible support made of ultrathin glass or plastic.

To date, a scattering layer having an organic/inorganic matrix having such a low charge of nonscattering high-index inorganic particles has never been proposed as it was believed that it was necessary, for good extraction of light, for the refractive index of the matrix of the scattering layer to be at least equal to that of the organic layers, of the transparent electrode or of the planarization layer.

It has been found that, in an embodiment, the refractive index of the matrix of the scattering layer could be lower provided that the scattering particles are gathered together (concentrated) in the immediate vicinity of the interface of the scattering layer with the neighbouring high-index layer, in the case in point the high-index organic polymer film. The expression "in the vicinity of the interface" or "in the immediate vicinity of the interface" used in the present patent application means, in this context, that the scattering particles are at a distance of less than 200 nm from the interface, that is to say that at least a fraction of their volume is located in the layer next to the interface, with a thickness of 200 nm.

In an embodiment, when a certain number of scattering particles per unit of surface area are sufficiently close to the interface with the high-index ($n_1$) layer, the scattering of light, originating from the high-index layer, by these particles takes place even if the matrix in which the scattering particle is found has an index of less than $n_1$.

Despite a jump in index which would ordinarily prevent any transmission of light for angles beyond a certain limiting angle (total internal reflection), the proximity with respect to the interface of the scattering particles can make possible a coupling between these particles and the evanescent wave which is propagated over a few hundred nm. This can be sufficient to scatter this light, which would be completely reflected in the absence of the scattering particles in the vicinity of the interface.

In an embodiment, after application of the photocurable or thermosetting liquid composition to the high-index organic polymer film, the combination is left standing for a time sufficient for the scattering particles to be able to migrate, by gravity, towards the bottom of the liquid layer deposited.

In an embodiment, the duration of this standing stage becomes shorter as the difference between the densities of the scattering particles and the liquid phase increases and as the viscosity of the liquid phase decreases.

In an embodiment, the standing stage of the film coated with the liquid composition, before the beginning of the curing stage, generally lasts between 20 seconds and 15 minutes, preferably between 1 minute and 13 minutes, in particular between 5 and 12 minutes.

In an embodiment, at the end of the phase of settling out of the scattering particles, the film made of organic polymer is heated or it is exposed to light or UV radiation in order to trigger the radical polymerization of the monomers/oligomers of the liquid phase.

In a particular embodiment of the process of the invention, the liquid composition comprises a photoinitiator which may be activated by UV radiation and stage (d) comprises the irradiation of the layer of liquid composition with UV radiation.

This stage of curing by polymerization and crosslinking may be preceded or followed by a stage of evaporation of the solvent.

The self-standing bilayer IEL thus prepared can be adhesively bonded to a rigid or flexible transparent substrate made of glass or of plastic. The adhesive bonding may be carried out in any way familiar to a person skilled in the art provided that the transparency of the combination is retained.

It is possible to envisage carrying out this adhesive bonding by applying the self-standing bilayer IEL, the scattering layer of which is only partially cured, to a transparent substrate and by subsequently completing the curing by irradiation or heating. In this embodiment, the manufacturer of the self-standing bilayer IEL is also the manufacturer of the substrate for OLED.

To retain the great flexibility of use of the self-standing bilayer IEL of the present invention, it would be highly advantageous to provide it with an adhesive layer which makes it possible to adhesively bond it to an appropriate substrate, well after it has been manufactured.

In a particular embodiment, the process of the present invention thus additionally comprises a stage (e) of application of an adhesive layer to the cured scattering layer. The adhesive forming this adhesive layer may be a hot-melt adhesive or a pressure-sensitive adhesive (PSA). In a known way, such a pressure-sensitive adhesive is advantageously protected by a plastic film intended to be removed immediately before adhesive bonding.

Embodiments are also drawn to a scattering polymer film (self-standing bilayer IEL) capable of being obtained by the process described above.

Such a scattering polymer film can include a first layer formed of a film made of polymer having a refractive index ($n_1$) at least equal to 1.70, a second layer, or scattering layer, directly in contact with the film made of polymer, comprising scattering particles having a size of between 200 nm and 2 μm, dispersed in a matrix having a refractive index ($n_2$) of between $n_1$-0.15 and $n_1$-0.03, the scattering particles being gathered together in the immediate vicinity of the interface between the first layer and the second layer.

The thickness of the first layer can be in a range of 50 μm to 200 μm and that of the second layer (scattering layer) can be in a range of 5 to 30 μm, or 8 to 20 μm.

In addition, this scattering polymer film may include an adhesive layer located on the face of the scattering layer opposite that in contact with the film made of organic polymer.

In an embodiment, the scattering layer advantageously comprises from 0.5 to 10% by volume, more particularly from 0.7 to 5% by volume, of scattering particles. These particles advantageously form a monolayer in the immediate vicinity of the interface between the film made of organic polymer and the cured scattering layer, that is to say that at least 70%, or at least 80%, or at least 90% by number of the particles are not separated from the said interface by another scattering particle along a direction perpendicular to the interface.

In an embodiment, the monolayer of scattering particles in the vicinity of the interface between the first layer and the second layer can be a fairly sparse monolayer, in other words the mean distance between the scattering particles is significantly greater than the mean size of the particles. The "density" of the population of particles at the interface may be expressed by a degree of coverage which is equal to the percentage of the surface area of the interface, between the film made of organic polymer and the scattering layer, covered by scattering particles. This degree of coverage is advantageously between 5% and 20%, preferably between 7% and 15%.

As may be seen in FIG. 1, in stage (a) of the process, a film 1 made of organic polymer having a refractive index $n_1$ at least equal to 1.70 is made available. In stage (b), a scattering liquid composition 2 comprising scattering particles 3 dispersed in a liquid matrix 4 which is a solution of monomers and/or oligomers is applied to this film made of organic polymer 1.

In stage (c), which lasts several minutes, the scattering particles 3 settle out by gravity up to the interface 5 between the scattering liquid composition 2 and the film made of organic polymer 1.

After the stage in which the scattering particles 3 settle out, the scattering liquid composition is exposed to ultraviolet radiation in order to polymerize the monomers/oligomers of the liquid matrix 4.

Finally, in stage (e), an adhesive layer 6 is deposited at the surface of the cured scattering layer.

EXAMPLE 49 parts by weight of dipentaerythritol pentaacrylate (SR-399, Sartomer), 15 parts by weight of pentaerythritol triacrylate (SR-444, Sartomer), 1 part by weight of polyethylene glycol diacrylate (SR-344, Sartomer), 31.97 parts by weight of ethanol, 0.03 part by weight of a surfactant (Tego Glide 410, Evonik), 1.33 parts by weight of a stabilizing agent (Tinuvin 292, Ciba) and 1.67 parts by weight of a photoinitiator (Irgacure 184®, Ciba) were mixed, so as to prepare a liquid phase of monomers/oligomers having a solids content of 65% by weight.

62% by volume of zirconia nanoparticles functionalized with acrylate groups (50% in PGMEA, Pixelligent), methyl ethyl ketone (solvent) and 1.4% by volume of $TiO_2$ scattering particles having a mean size of 400 nm (DuPont, Ti-Pure R-101) were incorporated in this solution.

The mixture was exposed to ultrasound for 15 seconds in order to homogenize the composition.

The suspension obtained was deposited, using a #6 Mayer rod, on a film of biaxially oriented PEN Teonex® Q65HA. The two refractive indices of this film, measured in the plane of the film along the two drawing directions, were 1.74 and 1.76. The index measured along the normal to the plane of the film was 1.5.

The coated film was left standing for 5 minutes in order to allow the $TiO_2$ scattering particles to settle out towards the bottom of the liquid phase.

The coating deposited was subsequently cured by exposing it to UV radiation (2000 EC lamp from Dymax, mercury bulb, 40 mW/cm$^2$) for 270 seconds.

After curing, the coating (scattering layer) had a thickness of approximately 10 μm. Its refractive index was 1.70.

Figure 2:
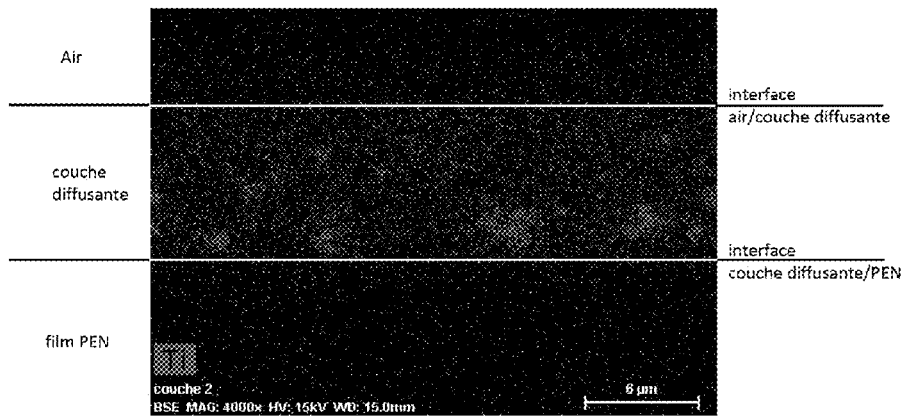
FIG. 2 represents the energy dispersive analysis (Energy-dispersive X-ray spectroscopy, EDX) results of the scattering film prepared in the example below, for titanium.

FIG. 2 shows the results of the EDX (Energy-dispersive X-ray spectroscopy) analysis for titanium of the scattering film obtained.

It is clearly apparent that the $TiO_2$ scattering particles settled out and gathered together at the "bottom" of the scattering layer, that is to say in the immediate vicinity of the interface of this layer with the underlying PEN film.

A certain number of particles were still found in the thickness of the scattering layer, which was certainly an indication that the duration of the stage of settling out would advantageously have been longer than 5 minutes.

The EDX photograph for zirconium shows a perfectly homogeneous distribution of this element throughout the thickness of the scattering layer.

Figure 3:
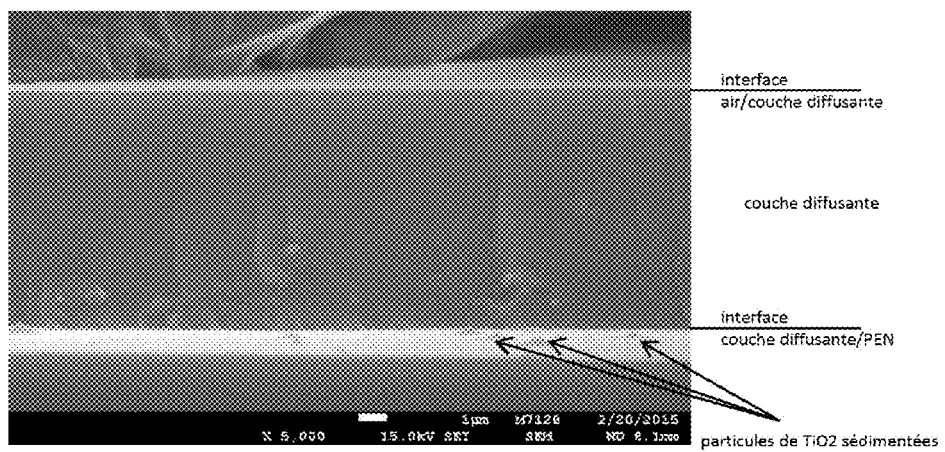
FIG. 3 is a SEM picture of the scattering layer on the PEN film.

FIG. 3 is a SEM picture showing a cross-section of the scattering layer on the PEN film. A few $TiO_2$ particles obviously have not completely settled out to the interface and are still "floating" in the hardened high index polymer matrix. One can however see—in the zone where the scattering layer has been accidentally separated from the underlying PEN film—that numerous $TiO_2$ particles have settled out down to the interface with the PEN film and are in contact therewith.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1

Process for the manufacture of a scattering polymer film comprising:

providing a film made of organic polymer having a refractive index ($n_1$) at least equal to 1.70, applying, to one of the faces of the said film, a liquid composition comprising scattering particles having a size of between 200 nm and 2 μm and optionally non-scattering nanoparticles having a size of less than 50 nm, dispersed in a solution of polymerizable organic monomers and/or oligomers, the said scattering particles having a density which is greater than that of the solution of organic monomers and/or oligomers, leaving the film made of organic polymer thus coated with a layer of liquid composition for a time sufficient to allow the scattering particles to settle out down to the interface with the film made of organic polymer, heating and/or irradiating the layer of liquid composition so as to polymerize the organic monomers and/or oligomers and to form a cured scattering layer, the organic monomers and/or oligomers and the non-scattering nanoparticles optionally present in the liquid composition being chosen so that the cured scattering layer has a refractive index ($n_2$) of between $n_1$-0.15 and $n_1$-0.03.

Embodiment 2

Process according to the preceding embodiment, characterized in that the liquid composition comprises from 0.2 to 5% by volume, preferably from 0.3 to 1.5% by volume, of scattering particles.

Embodiment 3

Process according to either one of the preceding embodiments, characterized in that the scattering particles are inorganic particles, preferably titanium dioxide ($TiO_2$) particles.

Embodiment 4

Process according to any one of the preceding embodiments, characterized in that the liquid composition comprises from 10 to 60% by volume of non-scattering particles having a refractive index of between 1.8 and 2.5.

Embodiment 5

Process according to Embodiment 4, characterized in that the non-scattering nanoparticles are $TiO_2$ or $ZrO_2$ particles.

Embodiment 6

Process according to any one of the preceding embodiments, characterized in that the duration of the standing stage of the film is between 20 seconds and 15 minutes, preferably between 1 minute and 13 minutes.

Embodiment 7

Process according to any one of the preceding embodiments, characterized in that it additionally comprises a stage (e) of application of an adhesive layer to the cured scattering layer, the adhesive layer preferably being a hot-melt adhesive or a pressure-sensitive adhesive (PSA).

Embodiment 8

Process according to any one of the preceding embodiments, characterized in that the organic polymer forming the film is chosen from polyesters or copolyesters based on naphthalene-2,6-dicarboxylic acid, on ethylene glycol and optionally on one or more comonomers, such as terephthalic acid, or a blend of poly(ethylene naphthalate) (PEN) and of poly(ethylene terephthalate) (PET).

Embodiment 9

Process according to any one of the preceding embodiments, characterized in that the film made of organic polymer is a uniaxially oriented or biaxially oriented film, the refractive index $n_1$ then being measured along a direction in the plane of the film.

Embodiment 10

Process according to any one of the preceding embodiments, characterized in that the polymerizable organic monomers and oligomers are chosen from (meth)acrylic monomers and oligomers.

Embodiment 11

Process according to any one of the preceding embodiments, characterized in that the liquid composition comprises a photoinitiator which may be activated by UV radiation and that stage (d) comprises the irradiation of the layer of liquid composition with UV radiation.

Embodiment 12

Scattering polymer film, comprising:
a first layer formed of a film made of polymer having a refractive index ($n_1$) at least equal to 1.70,
a second layer, or scattering layer, directly in contact with the film made of polymer, comprising scattering particles having a size of between 200 nm and 2 µm, in a matrix having a refractive index ($n_2$) of between $n_1$-0.15 and $n_1$-0.03, the scattering particles being concentrated in the immediate vicinity of the interface between the first layer and the second layer.

Embodiment 13

Scattering polymer film according to Embodiment 12, characterized in that the thickness of the cured scattering layer is between 5 and 30 µm, preferably between 8 and 20 µm.

Embodiment 14

Scattering polymer film according to Embodiment 12 or Embodiment 13, characterized in that the scattering layer comprises from 0.5 to 10% by volume, preferably from 0.7 to 5% by volume, of scattering particles.

Embodiment 15

Substrate for OLED comprising a scattering polymer film according to any one of Embodiments 12 to 14, adhesively bonded to a transparent substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

The invention claimed is:

1. A process of making a scattering polymer film comprising:
   (a) providing a film made of organic polymer having a refractive index ($n_1$) at least equal to 1.70,
   (b) applying, to one of the faces of the said film, a liquid composition comprising scattering particles having a size of between 200 nm and 2 µm dispersed in a solution of polymerizable organic monomers and/or oligomers, the scattering particles having a density which is greater than that of the solution of organic monomers and/or oligomers,
   (c) leaving the film made of organic polymer thus coated with a layer of liquid composition for a time sufficient to allow the scattering particles to settle out down to the interface with the film made of organic polymer,
   (d) heating and/or irradiating the layer of liquid composition so as to polymerize the organic monomers and/or oligomers and to form a cured scattering layer,
   the organic monomers and/or oligomers and the non-scattering nanoparticles optionally present in the liquid composition being chosen so that the cured scattering layer has a refractive index ($n_2$) of between $n_1$-0.15 and $n_1$-0.03.

2. The process of claim 1, where the liquid composition comprises from 0.2 to 5% by volume of scattering particles.

3. The process of claim 1, wherein the scattering particles are inorganic particles.

4. The process of claim 1, wherein the liquid composition comprises from 10 to 60% by volume of non-scattering particles having a refractive index of between 1.8 and 2.5.

5. The process of claim 4, the non-scattering nanoparticles include at least $TiO_2$ or $ZrO_2$ particles.

6. The process of claim 1, wherein a duration of a standing stage of the film is between 20 seconds and 15 minutes.

7. The process of claim 1, further comprising applying an adhesive layer to the cured scattering layer.

8. The process of claim 1, wherein the organic polymer forming the film is chosen from polyesters or copolyesters based on at least a naphthalene-2,6-dicarboxylic acid and an ethylene glycol.

9. The process of claim 1, wherein the film made of organic polymer is a uniaxially oriented or biaxially oriented film, the refractive index $n_1$ being measured along a direction in the plane of the film.

10. The process of claim 1, where the polymerizable organic monomers and/or oligomers are chosen from (meth) acrylic monomers and/or oligomers.

11. The process of claim 1, wherein the liquid composition comprises a photoinitiator able to be activated by UV radiation, and wherein stage (d) comprises irradiating the layer of liquid composition with UV radiation.

12. A scattering polymer film, comprising:
a first layer comprising a film comprising a polymer having a refractive index ($n_1$) at least equal to 1.70,
a second layer comprising a scattering layer, the second layer being directly in contact with the first layer, the second layer comprising scattering particles having a size of between 200 nm and 2 μm, in a matrix having a refractive index ($n_2$) of between $n_1$-0.15 and $n_1$-0.03, the scattering particles being concentrated adjacent an interface between the first layer and the second layer.

13. The scattering polymer film of claim 12, wherein the thickness of the cured scattering layer is in a range of 5 to 30 μm.

14. The scattering polymer film of claim 12, wherein the scattering layer comprises from 0.5 to 10% by volume of scattering particles.

15. A substrate for OLED comprising the scattering polymer film of claim 12, adhesively bonded to a transparent substrate.

* * * * *